(12) United States Patent
Gazzerro et al.

(10) Patent No.: US 12,113,499 B2
(45) Date of Patent: Oct. 8, 2024

(54) WIDEBAND CURRENT-MODE LOW-PASS FILTER CIRCUITS

(71) Applicant: QUALCOMM Incorporated, San Diego, CA (US)

(72) Inventors: Peter Gazzerro, San Diego, CA (US); Nitz Saputra, Burlingame, CA (US); Ashok Swaminathan, Cardiff, CA (US); Osama Elhadidy, San Diego, CA (US); Bo Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/068,837

(22) Filed: Dec. 20, 2022

(65) Prior Publication Data

US 2024/0204753 A1   Jun. 20, 2024

(51) Int. Cl.
| | | |
|---|---|---|
| *H03H 11/04* | (2006.01) | |
| *H03M 1/06* | (2006.01) | |
| *H03M 1/66* | (2006.01) | |
| *H04B 1/04* | (2006.01) | |

(52) U.S. Cl.
CPC ...... *H03H 11/0461* (2013.01); *H03M 1/0626* (2013.01); *H03M 1/66* (2013.01); *H04B 1/04* (2013.01)

(58) Field of Classification Search
CPC .................................................. H03H 11/0461
See application file for complete search history.

(56) References Cited

U.S. PATENT DOCUMENTS

| | | | |
|---|---|---|---|
| 5,966,005 A | 10/1999 | Fujimori | |
| 7,298,221 B2 * | 11/2007 | Yan | H03L 7/093 |
| | | | 331/16 |
| 8,350,619 B2 * | 1/2013 | Morikawa | H03F 3/347 |
| | | | 327/558 |
| 8,502,597 B2 | 8/2013 | Khatibi et al. | |

(Continued)

FOREIGN PATENT DOCUMENTS

EP    3089366 A1    11/2016

OTHER PUBLICATIONS

Voo T., et al., "A Novel High Speed Current Mirror Compensation Technique and Application," 1995 IEEE International Symposium on Circuits and Systems (ISCAS), vol. 3, 1995, pp. 2108-2111.

(Continued)

*Primary Examiner* — Jeffrey S Zweizig
(74) *Attorney, Agent, or Firm* — Patterson & Sheridan LLP

(57) ABSTRACT

Methods and apparatus for filtering a signal using a current-mode filter circuit implementing source degeneration. An example filter circuit generally includes an input node; an output node; a power supply node; a first transistor comprising a drain coupled to the input node; a second transistor comprising a drain coupled to the output node and comprising a gate coupled to a gate of the first transistor; a capacitive element coupled between the drain of the first transistor and the power supply node; a first resistive element coupled between the drain and the gate of the first transistor; a first source degeneration element coupled between a source of the first transistor and the power supply node; and a second source degeneration element coupled between a source of the second transistor and the power supply node.

24 Claims, 6 Drawing Sheets

(56) References Cited

U.S. PATENT DOCUMENTS

| | | | |
|---|---|---|---|
| 9,503,052 B1 * | 11/2016 | Chung | H03H 11/0466 |
| 10,666,285 B1 | 5/2020 | Mehdizad Taleie et al. | |
| 2010/0066442 A1 * | 3/2010 | Mu | H03H 11/1291 |
| | | | 327/553 |
| 2023/0336187 A1 * | 10/2023 | Saputra | H03M 1/785 |

OTHER PUBLICATIONS

International Search Report and Written Opinion—PCT/US2023/081814—ISA/EPO—Apr. 11, 2024.

* cited by examiner

WIDEBAND CURRENT-MODE LOW-PASS FILTER CIRCUITS

TECHNICAL FIELD

Certain aspects of the present disclosure generally relate to electronic circuits and, more particularly, to filter circuits.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TX DAC), which may be used, for example, to convert a digital signal to an analog signal for signal processing (e.g., filtering, upconverting, and amplifying) before transmission by one or more antennas. The filtering may be accomplished by a baseband filter, which may be implemented as a low-pass filter.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include higher image rejection, lower droop, reduced area, decreased power consumption, greater residual sideband (RSB) rejection, and/or higher signal-to-noise ratio (SNR).

Certain aspects of the present disclosure provide a filter circuit. The filter circuit generally includes an input node; an output node; a power supply node; a first transistor comprising a drain coupled to the input node; a second transistor comprising a drain coupled to the output node and comprising a gate coupled to a gate of the first transistor; a capacitive element coupled between the drain of the first transistor and the power supply node; a first resistive element coupled between the drain and the gate of the first transistor; a first source degeneration element coupled between a source of the first transistor and the power supply node; and a second source degeneration element coupled between a source of the second transistor and the power supply node.

Certain aspects of the present disclosure provide a filter circuit. The filter circuit generally includes an input node; an output node; a power supply node; a first capacitive element coupled between the input node and the power supply node; a first transistor; a second transistor comprising a drain coupled to the output node and comprising a gate coupled to a gate and a drain of the first transistor; a third transistor comprising a drain coupled to the drain of the first transistor and comprising a source coupled to the input node; a second capacitive element coupled between the source and a gate of the third transistor; a first resistive element coupled between the gate of the third transistor and a bias node of the filter circuit; a first source degeneration element coupled between a source of the first transistor and the power supply node; and a second source degeneration element coupled between a source of the second transistor and the power supply node.

Certain aspects of the present disclosure provide a transmitter circuit. The transmitter circuit generally includes the filter circuit as described herein, a digital-to-analog converter including an output coupled to the input node of the filter circuit; and a mixer including an input coupled to the output node of the filter circuit.

Certain aspects of the present disclosure provide a method of filtering a signal. The method generally includes receiving an input signal at a first branch of a current-mode filter circuit; and filtering the received input signal with the current-mode filter circuit to generate an output signal at a second branch of the current-mode filter circuit, wherein the first branch comprises a first source degeneration element and wherein the second branch comprises a second source degeneration element.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
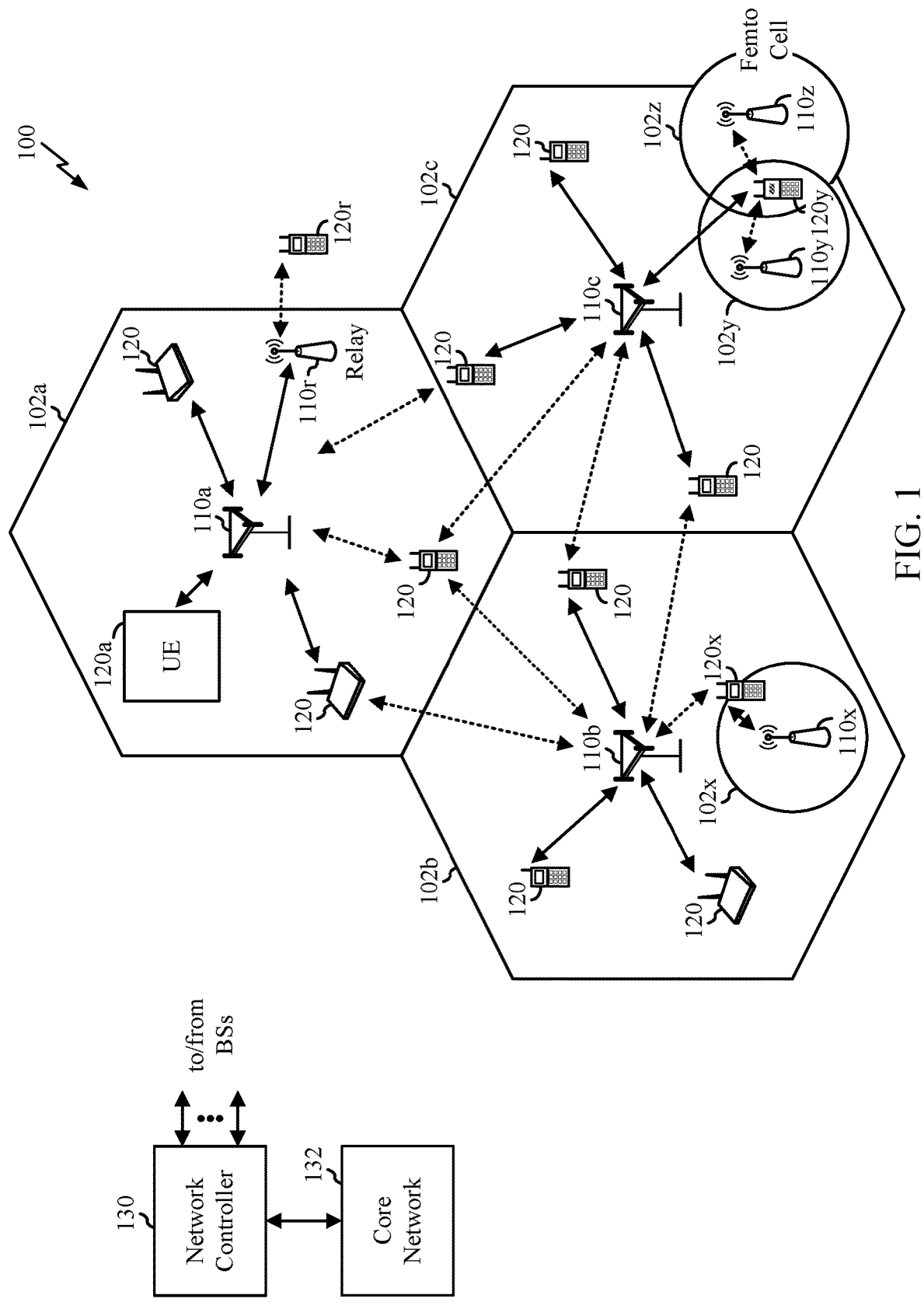
FIG. 1 is a diagram of an example wireless communications network, in which aspects of the present disclosure may be practiced.

Certain aspects of the present disclosure relate to a current-mode low-pass filter circuit with source degeneration. Such a filter circuit may be used, for example, as a baseband filter circuit in a wireless transmit path or as a filter in a high-speed transmitter. For certain aspects, the filter circuit is implemented as a current mirror and, in this case, may include a gate resistive element coupled between the gates of transistors in the current mirror branches. The filter circuit described herein may provide several advantages over at least some approaches, such as higher digital-to-analog converter (DAC) image rejection, lower droop, reduced area, decreased power consumption, greater residual sideband (RSB) rejection, and/or higher signal-to-noise ratio (SNR).

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

As used herein, the term "power supply node" generally refers to a power supply rail such as VDD or VSS (a nomenclature often used with field-effect transistor (FET) circuits) or a reference potential node (e.g., electrical ground), for a given circuit.

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn"

denotes the downlink, the subscript "up" denotes the uplink. $N_{up}$ UEs may be selected for simultaneous transmission on the uplink, Nan UEs may be selected for simultaneous transmission on the downlink. $N_{up}$ may or may not be equal to $N_{dn}$, and $N_{up}$ and Nan may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a baseband filter in a transmit path. This baseband filter may be implemented by a filter circuit (e.g., a current-mode, low-pass filter circuit) as described herein.

Figure 2:
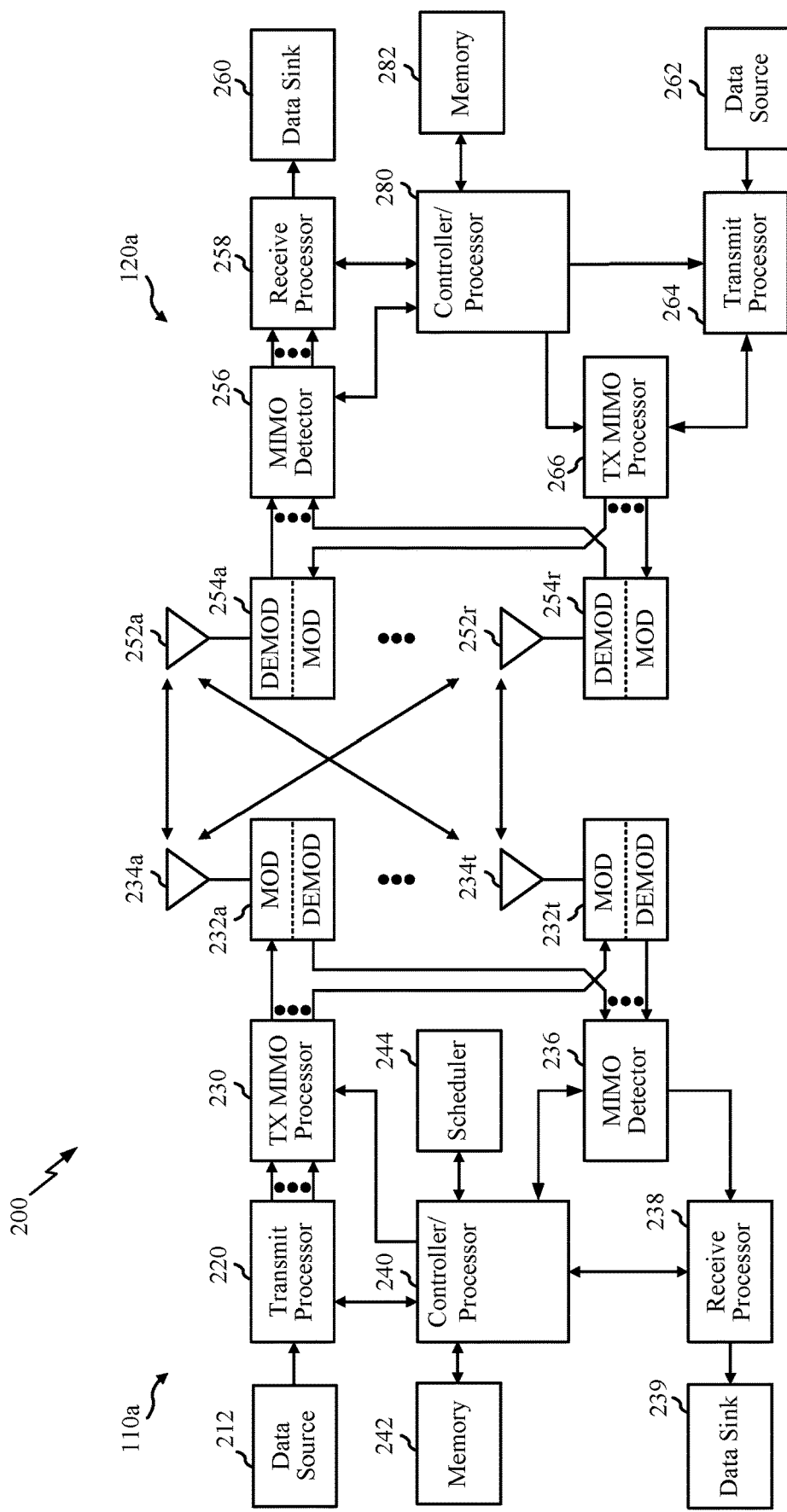
FIG. 2 is a block diagram conceptually illustrating a design of an example a base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)).

The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include a transmit path with a baseband filter. This baseband filter may be implemented by a filter circuit (e.g., a current-mode, low-pass filter circuit) as described herein.

Example RF Transceiver

Figure 3:
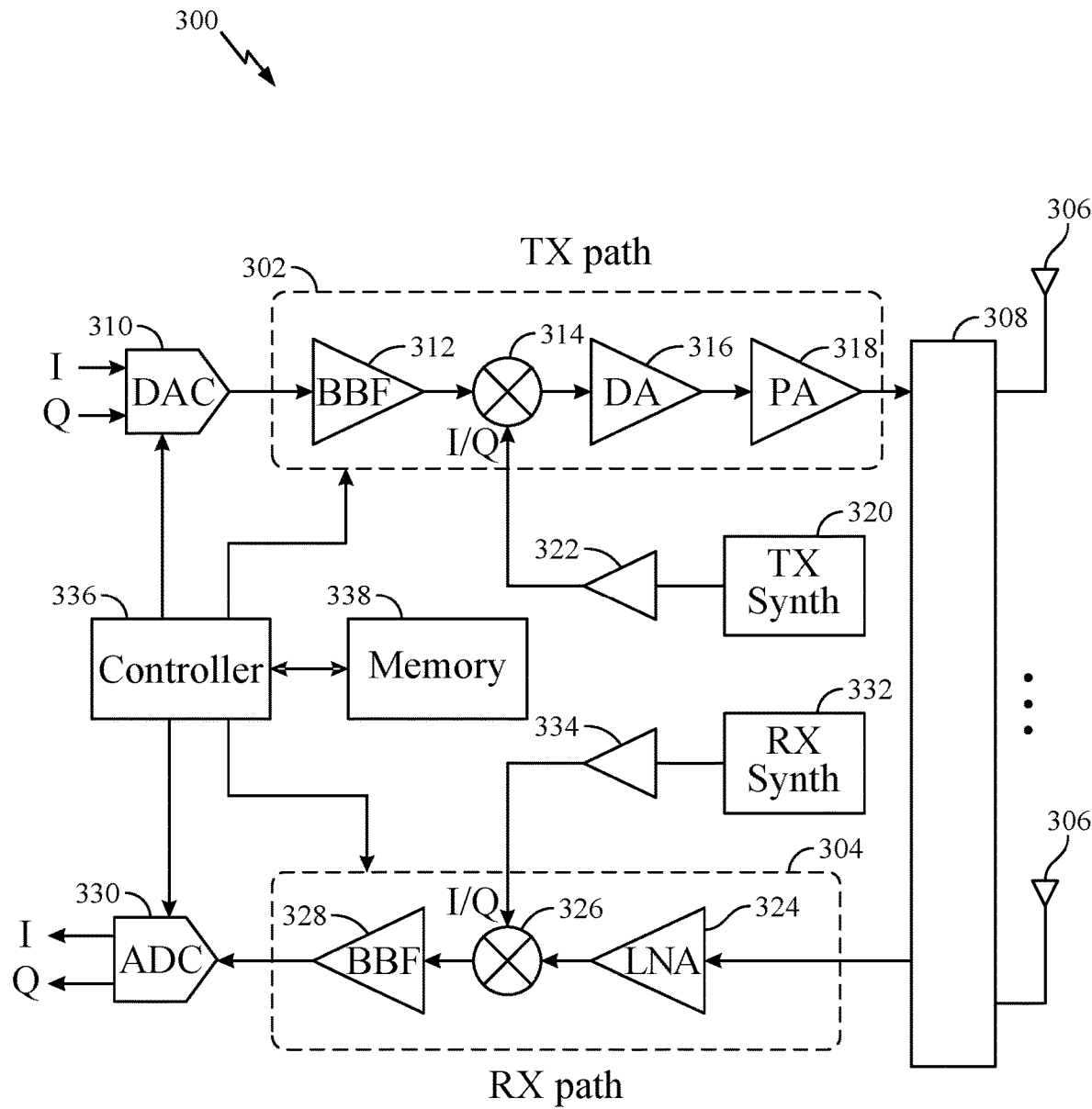
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The DAC 310 may be implemented by any of various suitable high-speed DAC topologies, such as a current-steering DAC. The BBF 312 may be implemented by a filter circuit (e.g., a current-mode, low-pass filter circuit) as described herein.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for filtering in any of various other suitable systems (e.g., high-speed transmitters).

Example Filter Circuits

Digital-to-analog converters (DACs), such as used in the transmit chain of wireless applications (e.g., DAC 310) and other applications, create unwanted images around multiple harmonics of the sampling frequency ($f_s$) at $n*f_s \pm f_{in}$, where n is a positive integer and $f_{in}$ is the frequency of the signal (e.g., the baseband signal) being generated by the DAC. Various wireless communication standards specify limits on power emissions, which call for significant attenuation of such images, especially the first ($f_s \pm f_{in}$) and second ($2f_s \pm f_{in}$) images. In wideband applications (e.g., 5G), a wideband baseband signal and a technology limited sampling frequency (e.g., a low $f_s/f_{in}$) makes the difference between the signal and image frequencies lower. As a consequence, it becomes more challenging to filter the images (e.g., with a baseband filter, such as BBF 312).

Some approaches to image rejection are complex to design, may consume significant power, and/or may occupy substantial chip area, such as the use of an auxiliary DAC clocked at $2f_s$ for interleaving with the main DAC. Other approaches to image rejection include using a higher-order filter. However, some such higher-order filters may have decreased signal-to-noise ratio (SNR) and reduced residual sideband (RSB) rejection, for example, compared to a simple current mirror filter circuit. In such implementations, especially for wideband signals, it may be challenging to balance between low droop and high image rejection.

Certain aspects of the present disclosure provide a wide-band current-mode low-pass filter circuit with a current-mirror topology using source degeneration, for example, to increase the signal-to-noise ratio (SNR), reduce the mismatch in the transistors and other components, decrease the direct-current (DC) offset drift over temperature, and enhance the residual sideband (RSB) rejection. Certain aspects of the present disclosure may also use a gate resistive element between the current mirror branches to provide peaking near the cutoff frequency (e.g., at the edge of the frequency band), hence decreasing droop, but without degrading image rejection. Certain aspects of the present disclosure may also provide low input impedance (Zin) and low common-mode voltage (VCM) for DAC linearity.

Figure 4A:
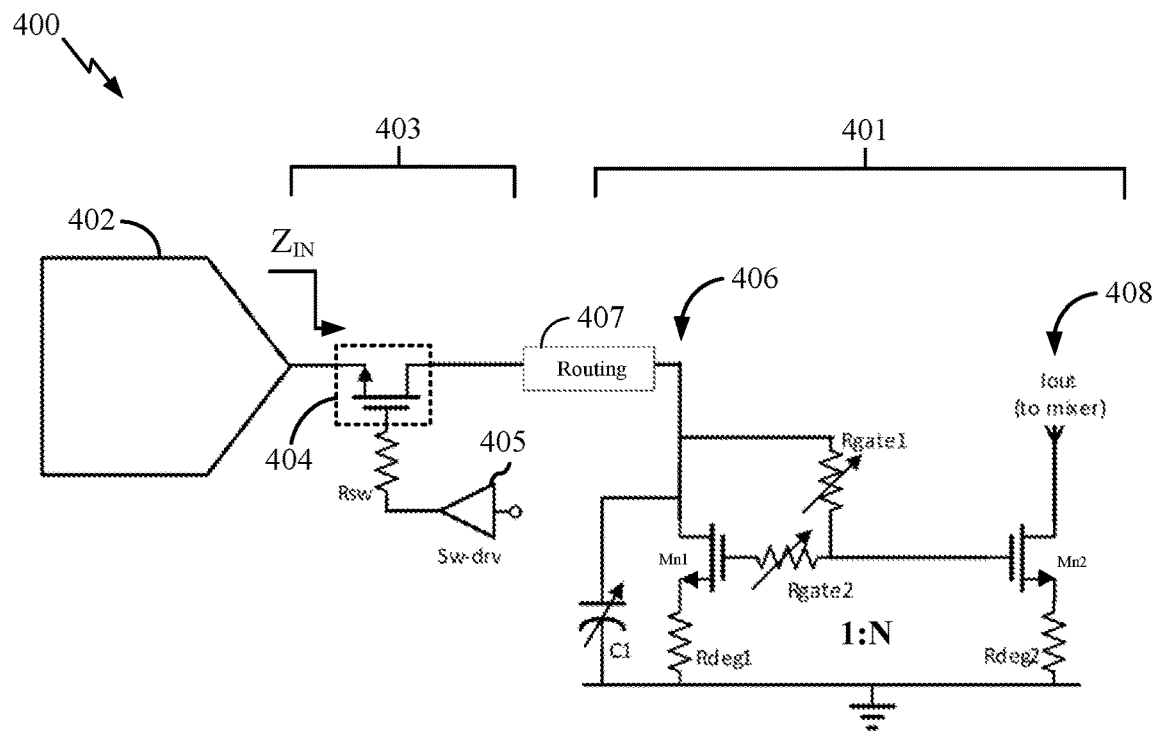
FIG. 4A is a circuit diagram of a portion of an example transmit path, illustrating a digital-to-analog converter (DAC) and a current-mode low-pass filter circuit with switching circuitry, in accordance with certain aspects of the present disclosure.

FIG. 4A is a circuit diagram of a portion of an example transmit path 400 (e.g., analogous to the TX path 302 of FIG. 3), in accordance with certain aspects of the present disclosure. The portion of the transmit path 400 includes a digital-to-analog converter (DAC) 402 (e.g., analogous to the DAC 310) having an output coupled to an input of a current-mode low-pass filter (LPF) circuit 401 (e.g., implementing the BBF 312).

The current-mode LPF circuit 401 has a current-mirror topology with a first branch 406 and a second branch 408. The first branch 406 includes an n-type transistor Mn1, which may be implemented by an n-type metal-oxide semiconductor (NMOS) transistor, as shown. The drain of transistor Mn1 is coupled to the input node of the current-mode LPF circuit 401. The second branch 408 of the current-mirror-type filter circuit includes an n-type transistor Mn2, which may also be implemented by an NMOS transistor, as shown. The drain of transistor Mn2 is coupled to the output node (labeled "Iout") of the LPF circuit 401, which may be coupled to an input of a mixer (e.g., mixer 314) in a wireless application. The transistor size ratio between transistors Mn1 and Mn2 may be 1:N, where N is a positive number (e.g., N=3).

To achieve its low-pass frequency response, the LPF circuit 401 includes a capacitive element C1 and a resistive element Rgate1. The shunt capacitive element C1 is coupled between the input node (and the drain of transistor Mn1) and a reference potential node (e.g., electrical ground, a power supply rail VSS, or another power supply node) for the circuit. For certain aspects, capacitive element C1 has a variable capacitance and may be implemented by an adjustable capacitor, a switched network of capacitors, or a combination thereof. A first terminal of resistive element Rgate1 may be coupled to the drain of transistor Mn1, and a second terminal of resistive element Rgate1 is coupled to the gate of transistor Mn2. For certain aspects, the resistive element Rgate1 has a variable resistance and may be implemented by an adjustable resistor, a switched network of resistors, or a combination thereof. The capacitive element C1 and the resistive element Rgate1 may be used to control the bandwidth of the LPF circuit 401, where a higher capacitance and/or a higher resistance results in a lower bandwidth (e.g., a lower cutoff frequency).

The LPF circuit 401 may utilize source degeneration in the branches 406, 408 of the current-mirror topology in an effort to increase the SNR, reduce the mismatch in the transistors Mn1 and Mn2 (and other components), decrease the DC offset drift over temperature, and enhance the RSB rejection of the filter circuit. Therefore, a first source degeneration element (e.g., resistive element Rdeg1) may be coupled between the source of transistor Mn1 and the reference potential node, and a second source degeneration element (e.g., resistive element Rdeg2) may be coupled between the source of transistor Mn2 and the reference potential node, as illustrated in FIG. 4A.

For certain aspects, the LPF circuit also includes a resistive element Rgate2 coupled between the gate of transistor Mn1 and the gate of transistor Mn2, where a terminal of resistive element Rgate2 coupled to the transistor Mn2 is also coupled to a terminal of resistive element Rgate1 coupled to the transistor Mn2, as shown. For certain aspects, the resistive element Rgate2 has a variable resistance and may be implemented by an adjustable resistor, a switched network of resistors, or a combination thereof. The resistive element Rgate2 may be used to provide peaking at the edge of the filter bandwidth (e.g., at the "band-edge"), hence decreasing droop, but without degrading image rejection.

Although the example LPF circuit of FIG. 4A (and other aspects presented herein) includes n-type transistors Mn1 and Mn2, the reader is to understand that the LPF circuits presented herein may alternatively be implemented as complementary filter circuits using p-type transistors. In such complementary filter circuits, instead of the capacitive element C1 and the source degeneration elements being coupled to the reference potential node, these components may be coupled to a power supply rail, such as VDD. For example, the first source degeneration element (e.g., resistive element Rdeg1) may be coupled between the source of transistor Mn1 (now a p-type transistor in this complementary implementation example) and the power supply rail, and a second source degeneration element (e.g., resistive element Rdeg2) may be coupled between the source of transistor Mn2 (now a p-type transistor in this example) and the power supply rail.

For certain aspects, as shown in FIG. 4A, the portion of the transmit path 400 may also include switching circuitry 403 coupled between the output of the DAC 402 and the input of the filter circuit (e.g., in cases where the output of the DAC is coupled to more than one circuit, such as to different TX paths or a test path). The switching circuitry 403 may include a switch 404 and a switch driver 405 (labeled "Sw-drv") having an output coupled to the control input of the switch 404. In some cases, the switch 404 may be implemented by a transistor (e.g., an n-type transistor, as illustrated in FIG. 4A) or a transmission gate. For certain aspects, the switching circuitry 403 may also include a resistive element Rsw coupled between the output of the switch driver 405 and the control input of the switch 404 (e.g., the gate of the transistor). Although the output of the DAC 402 and the switch 404 are depicted with a single-ended implementation in FIG. 4A, it is to be understood that the DAC 402 may have differential outputs and that the switch 404 may be implemented differentially in this case, with a resistive element Rsw for each switch in the differential pair of switches.

The switch 404 may have parasitic capacitance that affects the frequency response of the LPF circuit 401. For example, a transistor implementing the switch 404 may have gate-to-drain capacitance (Cgd) and gate-to-source capacitance (Cgs), which may shunt the DAC output signal to the low impedance of the switch driver output at higher frequencies. The resistive element Rsw may reduce the effect of these capacitances in the switch 404 by presenting a higher impedance path to the DAC output signal, thereby blocking the DAC output signal from the switch driver output, and forcing the DAC output signal to continue from the output of the DAC 402 to the input of the LPF circuit 401. Higher resistance for the resistive element Rsw may generally result in less band-edge droop and higher bandwidth for the combined frequency response of the portion of the transmit path 400.

According to certain aspects, the portion of the transmit path 400 may also include routing 407 (e.g., traces) coupled between the output of the DAC 402 (or the output of the switch 404 when present) and the input of the filter circuit. When the switch 404 is closed, the analog signal output by the DAC 402 may proceed (through the routing 407) to the input of the current-mode LPF circuit 401.

With the component additions described above (e.g., the degeneration elements), the combined switching circuitry 403 and LPF circuit 401 may have a higher input impedance (Zin) than some other approaches, but the common-mode voltage (VCM) may remain relatively low, such that the DAC linearity remains within desired limits. The portion of the transmit path 400 of FIG. 4A also offers lower complexity and occupies less area, compared to some other implementations.

Figure 4B:
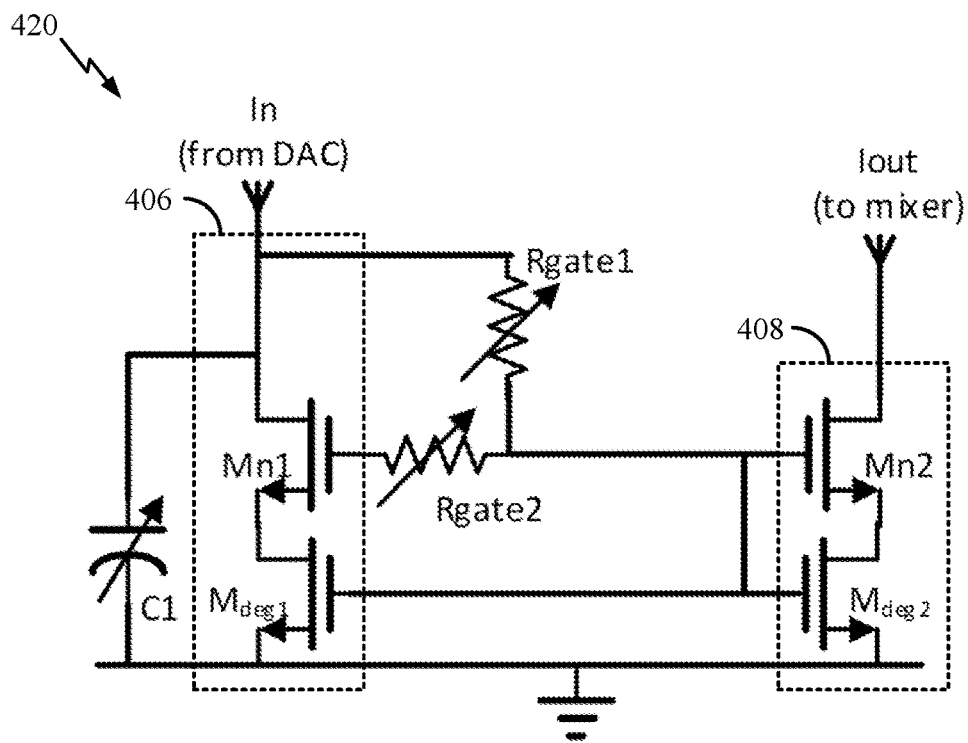
FIG. 4B is a circuit diagram illustrating a variation of the filter circuit in FIG. 4A, using transistors for degeneration, in accordance with certain aspects of the present disclosure.

FIG. 4B is a circuit diagram of another example filter circuit 420, which is a variation of the filter circuit 401 in FIG. 4A, in accordance with certain aspects of the present disclosure. Instead of using resistive elements for source degeneration, the filter circuit 420 uses n-type transistors Mdeg1 and Mdeg2 as source degeneration elements. The transistors Mdeg1 and Mdeg2 may have a transistor size ratio that matches the transistor size ratio (1:N) of the transistors Mn1 and Mn2.

As illustrated in FIG. 4B, the drain of transistor Mdeg1 is coupled to the source of transistor Mn1, the source of transistor Mdeg1 is coupled to the reference potential node (e.g., electrical ground or another power supply node) for the filter circuit 420, and the gate of transistor Mdeg1 is coupled to the gate of transistor Mdeg2. The drain of transistor Mdeg2 is coupled to the source of transistor Mn2, and the source of transistor Mdeg2 is coupled to the reference potential node. For certain aspects, as shown in FIG. 4B, transistors Mdeg1 and Mdeg2 may be biased by coupling the gates of transistors Mdeg1 and Mdeg2 to the gate of transistor Mn2. For other aspects, transistors Mdeg1 and Mdeg2 may be biased by coupling the gates of transistors Mdeg1 and Mdeg2 to another bias source (not shown), which uses a bias level that biases the transistors in the linear region.

By replacing the resistive elements Rdeg1 and Rdeg2 with transistors Mdeg1 and Mdeg2, respectively, the filter circuit 420 may have an improved frequency response. For example, the frequency response of the filter circuit 420 may exhibit less droop and/or greater attenuation compared to the frequency response of the filter circuit 401, other component values of the filter circuits being the same. Thus, the filter circuit 420 may offer a better trade-off in terms of droop versus image rejection compared to the filter circuit 401.

Figure 5A:
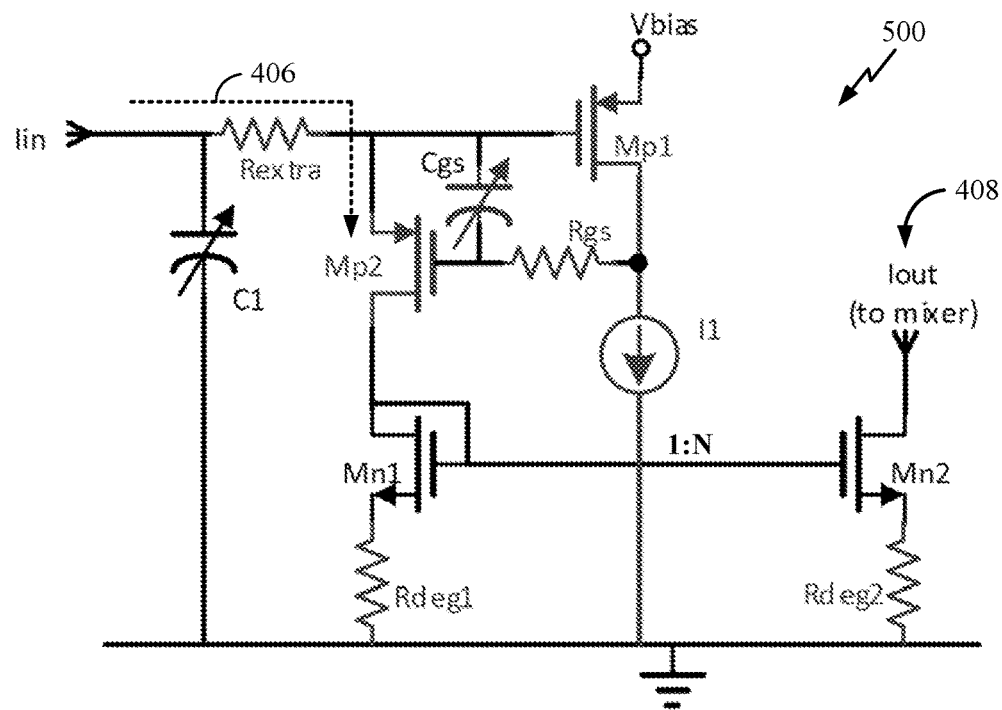
FIG. 5A is a circuit diagram of another example current-mode low-pass filter circuit, in accordance with certain aspects of the present disclosure.

FIG. 5A is a circuit diagram of another example current-mode low-pass filter circuit 500, in accordance with certain aspects of the present disclosure. The filter circuit 500 adds a gain-boosted p-type common-gate buffer and source degeneration elements to the current-mirror-type low-pass filter circuit. For example, in addition to the n-type transistors Mn1 and Mn2 and the capacitive element C1, the filter circuit 500 also includes p-type transistors Mp1 and Mp2, a capacitive element Cgs, resistive elements Rgs and Rextra, a current source I1, and source degeneration elements (e.g., resistive elements Rdeg1 and Rdeg2 or transistors Mdeg1 and Meg2).

The input node Iin of the filter circuit 500 is coupled to the reference potential node through shunt capacitive element C1. The first branch 406 of the current mirror in the filter circuit 500 includes resistive element Rextra, transistors Mp2 and Mn1, and a first source degeneration element (e.g., resistive element Rdeg1). The drain of transistor Mp2 is coupled to the drain of transistor Mn1, and the source of transistor Mp2 is coupled to the resistive element Rextra. The current mirror in the filter circuit 500 is formed by transistors Mn1 and Mn2, where the drain and gate of transistor Mn1 are coupled (e.g., shorted) together and to the gate of transistor Mn2. The second branch 408 of the current mirror in the filter circuit 500 includes transistor Mn2 and the second source degeneration element (e.g., resistive element Rdeg2).

The gain-boosted common-gate buffer is implemented by transistor Mp2, the capacitive element Cgs, the resistive element Rgs, the transistor Mp1, and the current source I1. The capacitive element Cgs and/or the resistive element Rgs may be variable. The source of transistor Mp2 is coupled to the gate of transistor Mp1, and the capacitive element Cgs is coupled between the gate and the source of transistor Mp2. The source of transistor Mp1 is coupled to a biasing node (labeled "Vbias"), and the drain of transistor Mp1 is coupled to the reference potential node through the current source I1. The resistive element Rgs is coupled between the gate of transistor Mp2 and the drain of transistor Mp1. In the topology of the filter circuit 500, transistor Mp1 provides transconductance (gm) boosting of transistor Mp2 at low frequency, with reduced boosting as frequency increases, thereby synthesizing an inductive element (to provide an active inductance) for the low-pass filter.

The degeneration elements in the filter circuit 500 may offer at least some of the same advantages as described above, such as increased SNR and higher RSB rejection, while also decreasing mismatch and DC offset drift over temperature. Compared to the filter circuits 401, 420, however, the filter circuit 500 may have reduced headroom (due to the cascoded transistors Mp2 and Mn1) and higher noise (e.g., due to noise peaking at high frequency, contributed from additional transistors Mp1 and Mp2). The filter circuit 500 may also have a higher common-mode voltage (VCM) than the filter circuits 401, 420, but have a sufficiently low Zin, such that the DAC linearity with the filter circuit 500 is acceptable.

Figure 5B:
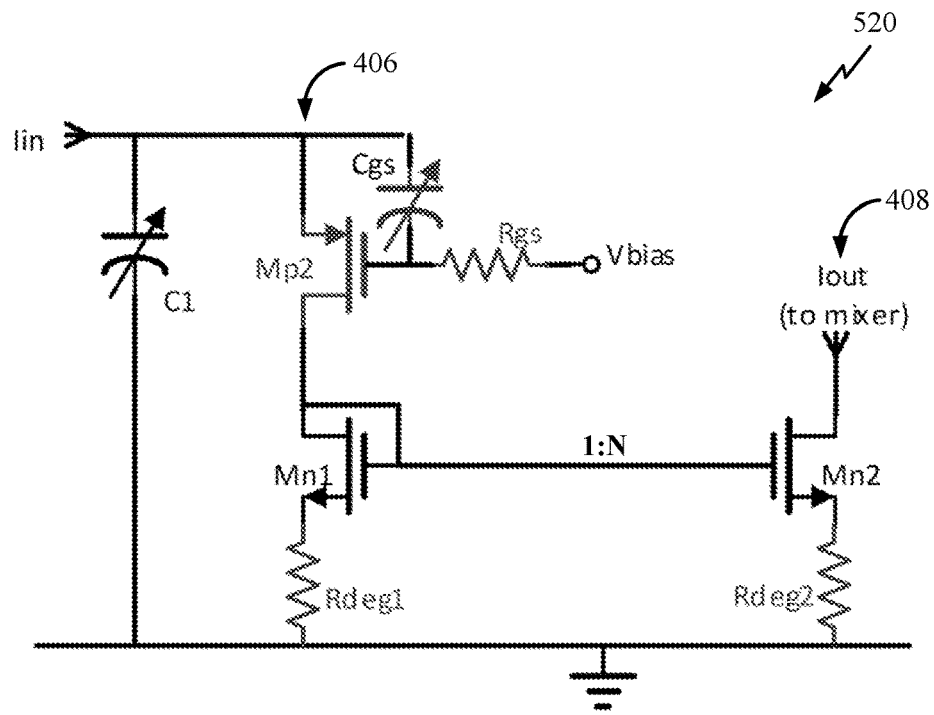
FIG. 5B is a circuit diagram of yet another example current-mode low-pass filter circuit, in accordance with certain aspects of the present disclosure.

FIG. 5B is a circuit diagram of yet another example current-mode low-pass filter circuit 520, in accordance with certain aspects of the present disclosure. The filter circuit 520 is a reduced component implementation of the filter circuit 500, and thus, much of the description for the filter circuit 500 above applies to the filter circuit 520, as well. The filter circuit 520 removes transistor Mp1, the current source I1, resistive element Rextra from the filter circuit 500 and couples the resistive element Rgs between the gate of transistor Mp2 and the biasing node (labeled "Vbias"). The biasing node of FIG. 5B may be at a different voltage level than the biasing node of FIG. 5A. With the removal of resistive element Rextra, the input node Iin is coupled to the source of transistor Mp2 in the filter circuit 520.

Due to this component removal, the filter circuit 520 may have lower power consumption and occupy less area than the filter circuit 500. The elements Cgs and Rgs may be used to impart some amount of effective inductance to the input impedance (Zin) of the common-gate buffer. Compared to the filter circuit 500, the filter circuit 520 may demonstrate decreased image rejection and increased droop. The filter circuit 520 may have a similar common-mode voltage as the filter circuit 500, but higher Zin, so the DAC linearity with the filter circuit 520 may be slightly worse than with the filter circuit 500.

Example Filtering Operations

Figure 6:
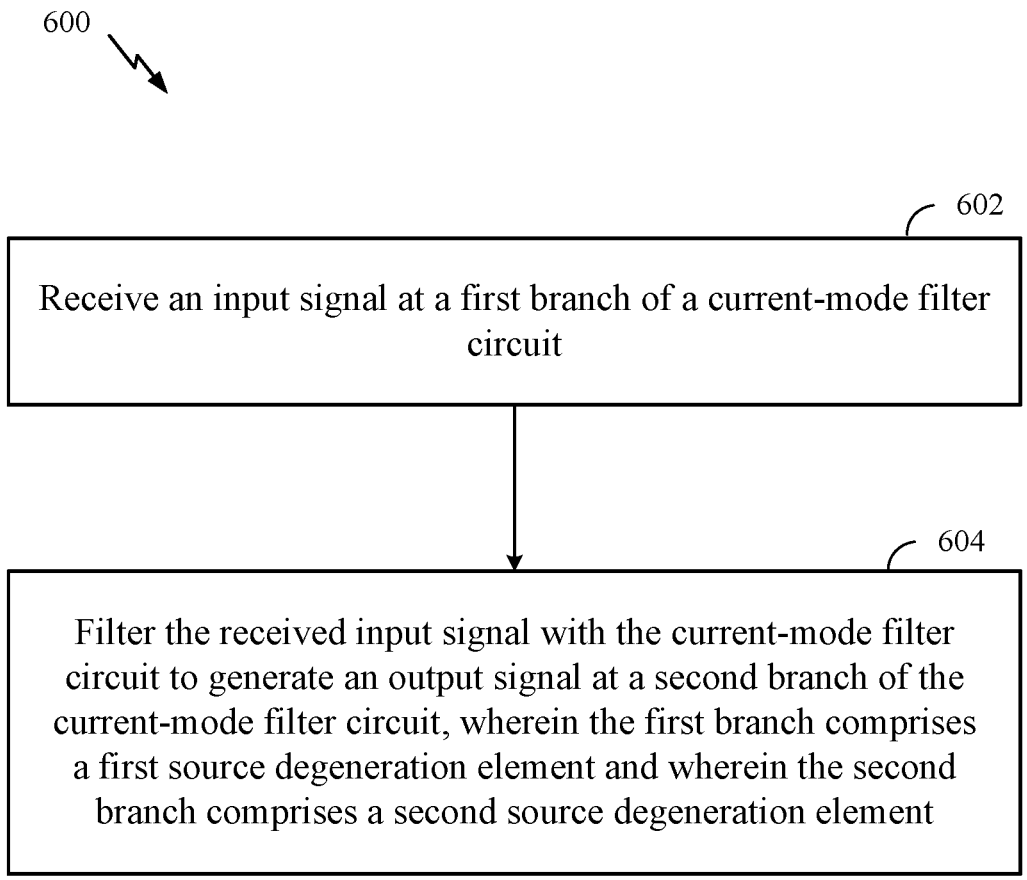
FIG. 6 is a flow diagram of example operations for filtering a signal, in accordance with certain aspects of the present disclosure.

FIG. 6 is a flow diagram of example operations 600 for filtering a signal, in accordance with certain aspects of the present disclosure. The operations 600 may be performed by a current-mode filter circuit, such as the filter circuits 401, 420, 500, and 520 illustrated in FIGS. 4A-5B.

The operations 600 may begin, at block 602, with the current-mode filter circuit receiving an input signal at a first branch (e.g., first branch 406) of the filter circuit. At block 604, the current-mode filter circuit may filter the received input signal to generate an output signal at a second branch (e.g., second branch 408) of the filter circuit. The first branch includes a first source degeneration element (e.g., transistor Mdeg1 or resistive element Rdeg1), and the second branch comprises a second source degeneration element (e.g., transistor Mdeg2 or resistive element Rdeg2). For certain aspects, the first source degeneration element includes a first transistor (e.g., transistor Mdeg1), and the second source degeneration element comprises a second transistor (e.g., transistor Mdeg2).

According to certain aspects, the first branch further comprises a first transistor (e.g., transistor Mn1) having a source coupled to the first source degeneration element, and the second branch further comprises a second transistor (e.g., transistor Mn2) having a source coupled to the second source degeneration element. In this case, a first resistive element (e.g., resistive element Rgate1) may be coupled between a gate and a drain of the first transistor, and a capacitive element (e.g., capacitive element C1) may be coupled to the drain of the first transistor. For certain aspects, the current-mode filter circuit further includes a second resistive element (e.g., resistive element Rgate2), the gate of the first transistor is coupled to a first terminal of the second resistive element, and a second terminal of the second resistive element is coupled to the gate of the second transistor. In this case, the first resistive element may have a first terminal coupled to the drain of the first transistor and have a second terminal coupled to the second terminal of the second resistive element and to the gate of the second transistor. For certain aspects, the operations 600 may further involve adjusting a resistance of at least one of the first resistive element or the second resistive element. For certain aspects, the operations 600 may further include driving a control input of a switch (e.g., switch 404) with a switch driver (e.g., switch driver 405). In this case, the switch may be coupled in series with the first branch of the current-mode filter circuit. For certain aspects, a third resistive element (e.g., resistive element Rsw) is coupled between an output of the switch driver and the control input of the switch.

According to certain aspects, the first branch further includes a first transistor (e.g., transistor Mn1) having a source coupled to the first source degeneration element and having a gate coupled to a drain of the first transistor, and the second branch further includes a second transistor (e.g., transistor Mn2) having a source coupled to the second source degeneration element. In this case, the first branch may further include a third transistor (e.g., transistor Mp2) including a drain coupled to the drain of the first transistor. For certain aspects, the current-mode filter circuit further includes a first capacitive element (e.g., capacitive element C1) coupled in parallel with the first branch, a second capacitive element (e.g., capacitive element Cgs) coupled between a source and a gate of the third transistor, and a first resistive element (e.g., resistive element Rgs) coupled to the gate of the third transistor. For certain aspects, the operations 600 further involve adjusting at least one of a capacitance of the first capacitive element, a capacitance of the second capacitive element, or a resistance of the first resistive element. For certain aspects, the current-mode filter circuit further includes a fourth transistor (e.g., transistor Mp1) having a drain coupled to the first resistive element and having a gate coupled to the source of the third transistor, a current source (e.g., current source I1) coupled to the drain of the fourth transistor, and a second resistive element (e.g., resistive element Rextra) coupled between the first capacitive element and the source of the third transistor.

Example Aspects

In addition to the various aspects described above, specific combinations of aspects are within the scope of the present disclosure, some of which are detailed below:

Aspect 1: A filter circuit comprising: an input node; an output node; a power supply node; a first transistor comprising a drain coupled to the input node; a second transistor comprising a drain coupled to the output node and comprising a gate coupled to a gate of the first transistor; a capacitive element coupled between the drain of the first transistor and the power supply node; a first resistive element coupled between the drain and the gate of the first transistor; a first source degeneration element coupled between a source of the first transistor and the power supply node; and a second source degeneration element coupled between a source of the second transistor and the power supply node.

Aspect 2: The filter circuit of Aspect 1, further comprising a second resistive element including a first terminal coupled to the gate of the first transistor and including a second terminal coupled to the gate of the second transistor, wherein the first resistive element comprises a first terminal coupled to the drain of the first transistor and comprises a second terminal coupled to the second terminal of the second resistive element and to the gate of the second transistor.

Aspect 3: The filter circuit of Aspect 2, further comprising: a switch coupled between the input node and the drain of the first transistor; a switch driver; and a third resistive element coupled between a control input of the switch and an output of the switch driver.

Aspect 4: The filter circuit of Aspect 2 or 3, wherein at least one of the first resistive element or the second resistive element is adjustable to provide a variable resistance.

Aspect 5: The filter circuit of Aspect 1, further comprising: a switch coupled between the input node and the drain of the first transistor; a switch driver; and a second resistive element coupled between a control input of the switch and an output of the switch driver.

Aspect 6: The filter circuit of Aspect 1, wherein the first source degeneration element comprises a second resistive element and wherein the second source degeneration element comprises a third resistive element.

Aspect 7: The filter circuit of any of the preceding Aspects, wherein: the first source degeneration element comprises a third transistor including a drain coupled to the source of the first transistor and including a source coupled to the power supply node; and the second source degeneration element comprises a fourth transistor including a drain coupled to the source of the second transistor and including a source coupled to the power supply node.

Aspect 8: The filter circuit of Aspect 7, wherein the third transistor comprises a gate coupled to a gate of the fourth transistor and to the gate of the second transistor.

Aspect 9: A transmitter circuit comprising the filter circuit of any of the preceding Aspects, the transmitter circuit further comprising: a digital-to-analog converter including an output coupled to the input node of the filter circuit; and a mixer including an input coupled to the output node of the filter circuit.

Aspect 10: A filter circuit comprising: an input node; an output node; a power supply node; a first capacitive element coupled between the input node and the power supply node; a first transistor; a second transistor comprising a drain coupled to the output node and comprising a gate coupled to a gate and a drain of the first transistor; a third transistor comprising a drain coupled to the drain of the first transistor and comprising a source coupled to the input node; a second capacitive element coupled between the source and a gate of the third transistor; a first resistive element coupled between the gate of the third transistor and a bias node of the filter circuit; a first source degeneration element coupled between a source of the first transistor and the power supply node; and a second source degeneration element coupled between a source of the second transistor and the power supply node.

Aspect 11: The filter circuit of Aspect 10, wherein at least one of the second capacitive element or the first resistive element is adjustable.

Aspect 12: The filter circuit of Aspect 10 or 11, wherein the first source degeneration element comprises a second resistive element and wherein the second source degeneration element comprises a third resistive element.

Aspect 13: The filter circuit of any of Aspects 10 to 12, wherein: the first source degeneration element comprises a fourth transistor including a drain coupled to the source of the first transistor and including a source coupled to the power supply node; and the second source degeneration element comprises a fifth transistor including a drain coupled to the source of the second transistor and including a source coupled to the power supply node.

Aspect 14: The filter circuit of Aspect 13, wherein the fifth transistor comprises a gate coupled to a gate of the fourth transistor and to the gate of the second transistor.

Aspect 15: The filter circuit of any of Aspects 10 to 14, further comprising: a switch coupled between the input node and the source of the third transistor; a switch driver; and a second resistive element coupled between a control input of the switch and an output of the switch driver.

Aspect 16: The filter circuit of Aspect 10 or 11, further comprising: a fourth transistor including a source coupled to the bias node, including a drain coupled to the first resistive element, and including a gate coupled to the source of the third transistor; a current source coupled between the drain of the fourth transistor and the power supply node; and a second resistive element coupled between the input node and the source of the third transistor.

Aspect 17: A transmitter circuit comprising the filter circuit of any of Aspects 10 to 16, the transmitter circuit further comprising: a digital-to-analog converter including an output coupled to the input node of the filter circuit; and a mixer including an input coupled to the output node of the filter circuit.

Aspect 18: A method of filtering, comprising: receiving an input signal at a first branch of a current-mode filter circuit; and filtering the received input signal with the current-mode filter circuit to generate an output signal at a second branch of the current-mode filter circuit, wherein the first branch comprises a first source degeneration element and wherein the second branch comprises a second source degeneration element.

Aspect 19: The method of Aspect 18, wherein the first source degeneration element comprises a first transistor and wherein the second source degeneration element comprises a second transistor.

Aspect 20: The method of Aspect 18 or 19, wherein: the first branch further comprises a first transistor including a source coupled to the first source degeneration element; a first resistive element is coupled between a gate and a drain of the first transistor; a capacitive element is coupled to the drain of the first transistor; and the second branch further comprises a second transistor including a source coupled to the second source degeneration element.

Aspect 21: The method of Aspect 20, wherein: the current-mode filter circuit further comprises a second resistive element; the gate of the first transistor is coupled to a first terminal of the second resistive element; a second terminal of the second resistive element is coupled to the gate of the second transistor; and the first resistive element comprises a first terminal coupled to the drain of the first transistor and comprises a second terminal coupled to the second terminal of the second resistive element and to the gate of the second transistor.

Aspect 22: The method of Aspect 21, further comprising adjusting a resistance of at least one of the first resistive element or the second resistive element.

Aspect 23: The method of Aspect 21 or 22, further comprising driving a control input of a switch with a switch driver, wherein the switch is coupled in series with the first branch of the current-mode filter circuit and wherein a third resistive element is coupled between an output of the switch driver and the control input of the switch.

Aspect 24: The method of Aspect 18, wherein: the first branch further comprises a first transistor including a source coupled to the first source degeneration element and including a gate coupled to a drain of the first transistor; the second branch further comprises a second transistor including a source coupled to the second source degeneration element; the first branch further comprises a third transistor including a drain coupled to the drain of the first transistor; and the current-mode filter circuit further comprises: a first capacitive element coupled in parallel with the first branch; a second capacitive element coupled between a source and a gate of the third transistor; and a first resistive element coupled to the gate of the third transistor.

Aspect 25: The method of Aspect 24, further comprising adjusting at least one of a capacitance of the first capacitive element, a capacitance of the second capacitive element, or a resistance of the first resistive element.

Aspect 26: The method of Aspect 24 or 25, wherein the current-mode filter circuit further comprises: a fourth transistor including a drain coupled to the first resistive element and including a gate coupled to the source of the third transistor; a current source coupled to the drain of the fourth transistor; and a second resistive element coupled between the first capacitive element and the source of the third transistor.

Additional Considerations

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A filter circuit comprising:
an input node;
an output node;
a power supply node;
a first transistor comprising a drain coupled to the input node;
a second transistor comprising a drain coupled to the output node and comprising a gate coupled to a gate of the first transistor;
a capacitive element coupled between the drain of the first transistor and the power supply node;
a first resistive element coupled between the drain and the gate of the first transistor;
a first source degeneration element coupled between a source of the first transistor and the power supply node;
a second source degeneration element coupled between a source of the second transistor and the power supply node;
a switch coupled between the input node and the drain of the first transistor;
a switch driver; and
a second resistive element coupled between a control input of the switch and an output of the switch driver.

2. The filter circuit of claim 1, wherein the first source degeneration element comprises a third resistive element and wherein the second source degeneration element comprises a fourth resistive element.

3. The filter circuit of claim 1, wherein:
the first source degeneration element comprises a third transistor including a drain coupled to the source of the first transistor and including a source coupled to the power supply node; and
the second source degeneration element comprises a fourth transistor including a drain coupled to the source of the second transistor and including a source coupled to the power supply node.

4. A transmitter circuit comprising the filter circuit of claim 1, the transmitter circuit further comprising:
a digital-to-analog converter including an output coupled to the input node of the filter circuit; and
a mixer including an input coupled to the output node of the filter circuit.

5. A filter circuit comprising:
an input node;
an output node;
a power supply node;
a first transistor comprising a drain coupled to the input node;
a second transistor comprising a drain coupled to the output node and comprising a gate coupled to a gate of the first transistor;
a capacitive element coupled between the drain of the first transistor and the power supply node;
a first resistive element coupled between the drain and the gate of the first transistor;
a second resistive element including a first terminal coupled to the gate of the first transistor and including a second terminal coupled to the gate of the second transistor, wherein the first resistive element comprises a first terminal coupled to the drain of the first transistor and comprises a second terminal coupled to the second terminal of the second resistive element and to the gate of the second transistor;
a first source degeneration element coupled between a source of the first transistor and the power supply node; and a second source degeneration element coupled between a source of the second transistor and the power supply node.

6. The filter circuit of claim 5, further comprising:
a switch coupled between the input node and the drain of the first transistor;
a switch driver; and
a third resistive element coupled between a control input of the switch and an output of the switch driver.

7. The filter circuit of claim 5, wherein at least one of the first resistive element or the second resistive element is adjustable to provide a variable resistance.

8. The filter circuit of claim 6, wherein at least one of the first resistive element or the second resistive element is adjustable to provide a variable resistance.

9. The filter circuit of claim 5, wherein the first source degeneration element comprises a third resistive element and wherein the second source degeneration element comprises a fourth resistive element.

10. The filter circuit of claim 5, wherein:
the first source degeneration element comprises a third transistor including a drain coupled to the source of the first transistor and including a source coupled to the power supply node; and
the second source degeneration element comprises a fourth transistor including a drain coupled to the source of the second transistor and including a source coupled to the power supply node.

11. A transmitter circuit comprising the filter circuit of claim 5, the transmitter circuit further comprising:
a digital-to-analog converter including an output coupled to the input node of the filter circuit; and
a mixer including an input coupled to the output node of the filter circuit.

12. A filter circuit comprising:
an input node;
an output node;
a power supply node;
a first transistor comprising a drain coupled to the input node;
a second transistor comprising a drain coupled to the output node and comprising a gate coupled to a gate of the first transistor;
a capacitive element coupled between the drain of the first transistor and the power supply node;
a first resistive element coupled between the drain and the gate of the first transistor;
a first source degeneration element coupled between a source of the first transistor and the power supply node; and
a second source degeneration element coupled between a source of the second transistor and the power supply node, wherein:
the first source degeneration element comprises a third transistor including a drain coupled to the source of the first transistor and including a source coupled to the power supply node;
the second source degeneration element comprises a fourth transistor including a drain coupled to the source of the second transistor and including a source coupled to the power supply node; and
the third transistor comprises a gate coupled to a gate of the fourth transistor and to the gate of the second transistor.

13. The filter circuit of claim 12, wherein the gate of the third transistor is shorted to the gate of the fourth transistor and to the gate of the second transistor.

14. The filter circuit of claim 12, further comprising a second resistive element including a first terminal coupled to the gate of the first transistor and including a second terminal coupled to the gate of the second transistor, the gate of the third transistor, and the gate of the fourth transistor, wherein the first resistive element comprises a first terminal coupled to the drain of the first transistor and comprises a second terminal coupled to the second terminal of the second resistive element.

15. The filter circuit of claim 14, wherein at least one of the first resistive element or the second resistive element is adjustable to provide a variable resistance.

16. A transmitter circuit comprising the filter circuit of claim 12, the transmitter circuit further comprising:
a digital-to-analog converter including an output coupled to the input node of the filter circuit; and
a mixer including an input coupled to the output node of the filter circuit.

17. A filter circuit comprising:
an input node;
an output node;
a power supply node;
a first capacitive element coupled between the input node and the power supply node;
a first transistor;
a second transistor comprising a drain coupled to the output node and comprising a gate coupled to a gate and a drain of the first transistor;
a third transistor comprising a drain coupled to the drain of the first transistor and comprising a source coupled to the input node;
a second capacitive element coupled between the source and a gate of the third transistor;
a first resistive element coupled between the gate of the third transistor and a bias node of the filter circuit;
a first source degeneration element coupled between a source of the first transistor and the power supply node; and
a second source degeneration element coupled between a source of the second transistor and the power supply node.

18. The filter circuit of claim 17, wherein at least one of the second capacitive element or the first resistive element is adjustable.

19. The filter circuit of claim 17, wherein the first source degeneration element comprises a second resistive element and wherein the second source degeneration element comprises a third resistive element.

20. The filter circuit of claim 17, wherein:
the first source degeneration element comprises a fourth transistor including a drain coupled to the source of the first transistor and including a source coupled to the power supply node; and
the second source degeneration element comprises a fifth transistor including a drain coupled to the source of the second transistor and including a source coupled to the power supply node.

21. The filter circuit of claim 20, wherein the fifth transistor comprises a gate coupled to a gate of the fourth transistor and to the gate of the second transistor.

22. The filter circuit of claim 17, further comprising:
a switch coupled between the input node and the source of the third transistor;
a switch driver; and
a second resistive element coupled between a control input of the switch and an output of the switch driver.

23. The filter circuit of claim 17, further comprising:
a fourth transistor including a source coupled to the bias node, including a drain coupled to the first resistive element, and including a gate coupled to the source of the third transistor;
a current source coupled between the drain of the fourth transistor and the power supply node; and
a second resistive element coupled between the input node and the source of the third transistor.

24. A transmitter circuit comprising the filter circuit of claim 17, the transmitter circuit further comprising:
a digital-to-analog converter including an output coupled to the input node of the filter circuit; and
a mixer including an input coupled to the output node of the filter circuit.

* * * * *